United States Patent [19]
Kollman et al.

[11] Patent Number: 5,804,943
[45] Date of Patent: Sep. 8, 1998

[54] RESONANT BILATERAL CHARGING AND DISCHARGING CIRCUIT

[75] Inventors: Robert L. Kollman, Plano; James G. Sills, Dallas, both of Tex.

[73] Assignee: Texas Instruments Incorporated, Dallas, Tex.

[21] Appl. No.: 439,933

[22] Filed: May 12, 1995

[51] Int. Cl.⁶ .................. H03K 19/094; H03K 17/00; G05F 1/04
[52] U.S. Cl. .................. 320/1; 327/365; 323/290
[58] Field of Search .................. 320/1; 323/289, 323/290; 327/108, 109, 365, 390, 391

[56] References Cited

U.S. PATENT DOCUMENTS

| | | | |
|---|---|---|---|
| 4,967,109 | 10/1990 | Steigerwald | 327/434 |
| 4,980,649 | 12/1990 | Gulczynski | 330/10 |
| 5,010,261 | 4/1991 | Steigerwald | 327/404 |
| 5,231,037 | 7/1993 | Yuan et al. | 437/40 |
| 5,264,736 | 11/1993 | Jacobsen | 327/365 |

*Primary Examiner*—Peter S. Wong
*Assistant Examiner*—Patrick B. Law
*Attorney, Agent, or Firm*—Carlton H. Hoel; W. James Brady; Richard L. Donaldson

[57] ABSTRACT

A bilateral switch (302) plus inductance (304) to drive a capacitive load (306 plus 350) by resonant charging and discharging the load.

10 Claims, 3 Drawing Sheets

RESONANT BILATERAL CHARGING AND DISCHARGING CIRCUIT

GOVERNMENT CONTRACT

This invention was made with Government support under Contract No. N66001-91C-6008 awarded by the Department of the Navy. The government has certain rights in this invention.

BACKGROUND OF THE INVENTION

The invention relates to electronic devices, and, more particularly, to switching power supplies and drivers.

Electronic components, such as integrated circuits and displays, typically have power requirements which differ from the primary power supply characteristics. For example, portable computers may contain integrated circuits operating with a 3.3 volt DC supply and a backlit display screen operating at 1500 volts but the primary power consists of rechargeable batteries whose output voltage at full charge may be 5 volts and which drops exponentially as the batteries are discharged. Hence, electronic systems typically will include power supplies with AC-DC converters, DC-DC regulators, or DC-AC inverters to provide output power with the required characteristics.

DC-DC regulators most commonly utlilize switching regulation and frequently use a push-pull arrangement as illustrated in FIG. 1a with waveforms shown in FIG. 1b. Basically, the pulse width modulated (PWM) driver alternately switches on and off power devices Q1 and Q2 to excite the transformer primary, and the transformer secondary feeds a self-commuting synchronous rectifier followed by an LC filter for output. The synchronous rectifier uses n-channel MOSFETs rather than diodes; this avoids the turn on voltage drop of diodes which can be significant for low output voltage power supplies. Resistor divider R senses the output voltage and feeds this back to the PWM driver. If the output voltage is too low, then the PWM driver increases the duty cycles of Q1 and Q2, and conversely, if the output voltage is too high, the duty cycles of Q1 and Q2 are reduced. The PWM driver may simply be an error amplifier (amplifying the difference between desired and actual output voltages) feeding one input of a comparator with a sawtooth voltage having a fixed frequency feeding the other comparator input; the comparator output would be the input signal for a driver for power device Q1 and a similar phase-shifted comparator would be the input signal for a driver for power device Q2. FIG. 1c illustrates such a possible half of a PWM driver.

Switching power supplies generally benefit from higher switching frequencies because the size of and the losses in the magnetic portions (transformers and inductors) can be reduced. However, higher switching frequencies implies increased losses in the power device driver circuits. In particular, the driver circuit supplies a current to charge up the input (gate) capacitance to turn on a MOSFET, and when the MOSFET turns off the driver circuit sinks a current to discharge the gate. Thus the dissipation increases linearly with switching frequency.

Jacobson, High Frequency Resonant Gate Driver with Partial Energy Recovery, High Frequency Power Conversion 1993 Conference, Technical Papers, pages 133–141 (1993) discloses a driver circuit to partially recover However, the driver circuit has problems including the requirement of four power components (two FETs and two diodes), a split inductor, excessive energy circulation during operation, and current carrying by devices in series.

Junction field effect transistors (JFETs) typically are depletion mode symmetric devices with n-channels and require a negative voltage to pinch off the channel to turn off. JFETs may be made of gallium arsenide to lower the channel and drift region resistance ($R_{ON}$) due to the higher electron mobility of gallium arsenide as compared to silicon. JFETs frequently have a vertical channel structure and thus may be called VFETs. FIGS. 2a–b heuristically illustrate in perspective and cross sectional elevation views VFET 100 as including source 102, multifinger gate 104, channel region 106 between the gate fingers, drain 108, source contact 112, gate contact 114, and drain contact 118. U.S. Pat. No. 5,231,037 describes a method of fabrication for such VFETs.

SUMMARY OF THE INVENTION

The present invention provides resonant charging and discharging of a capacitive load through a bilateral switch plus series inductance to recover stored capacitive energy. This has the advantage of being able to switch power MOSFETs and drive LCDs without the usual $CV^2/2$ losses in the turn on and turn off transitions with capacitive loads and only uses one transistor. Preferred embodiments use a gallium arsenide vertical field effect transistor (VFET) for the bilateral switch; this provides a low on resistance to further limit resistive losses.

BRIEF DESCRIPTION OF THE DRAWINGS

The drawings are schematic for clarity.

DESCRIPTION OF THE PREFERRED EMBODIMENTS

First preferred embodiment overview

Figure 1A:
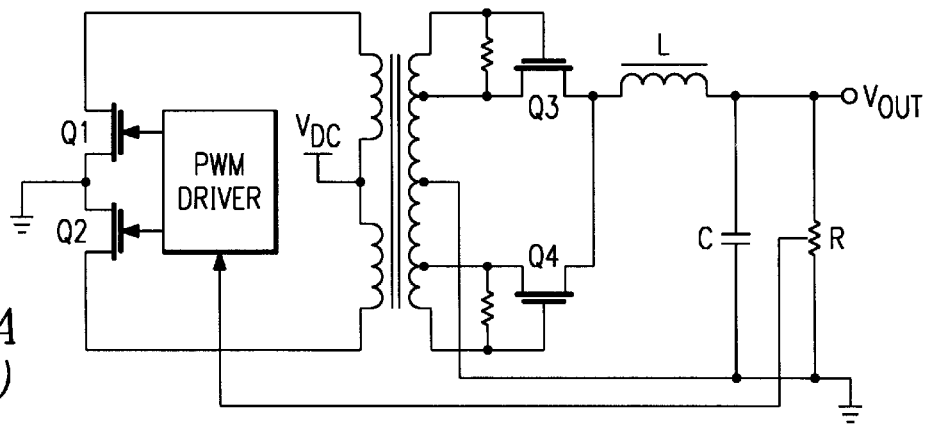
FIGS. 1a–c show known power switching circuitry.
Figure 1B:
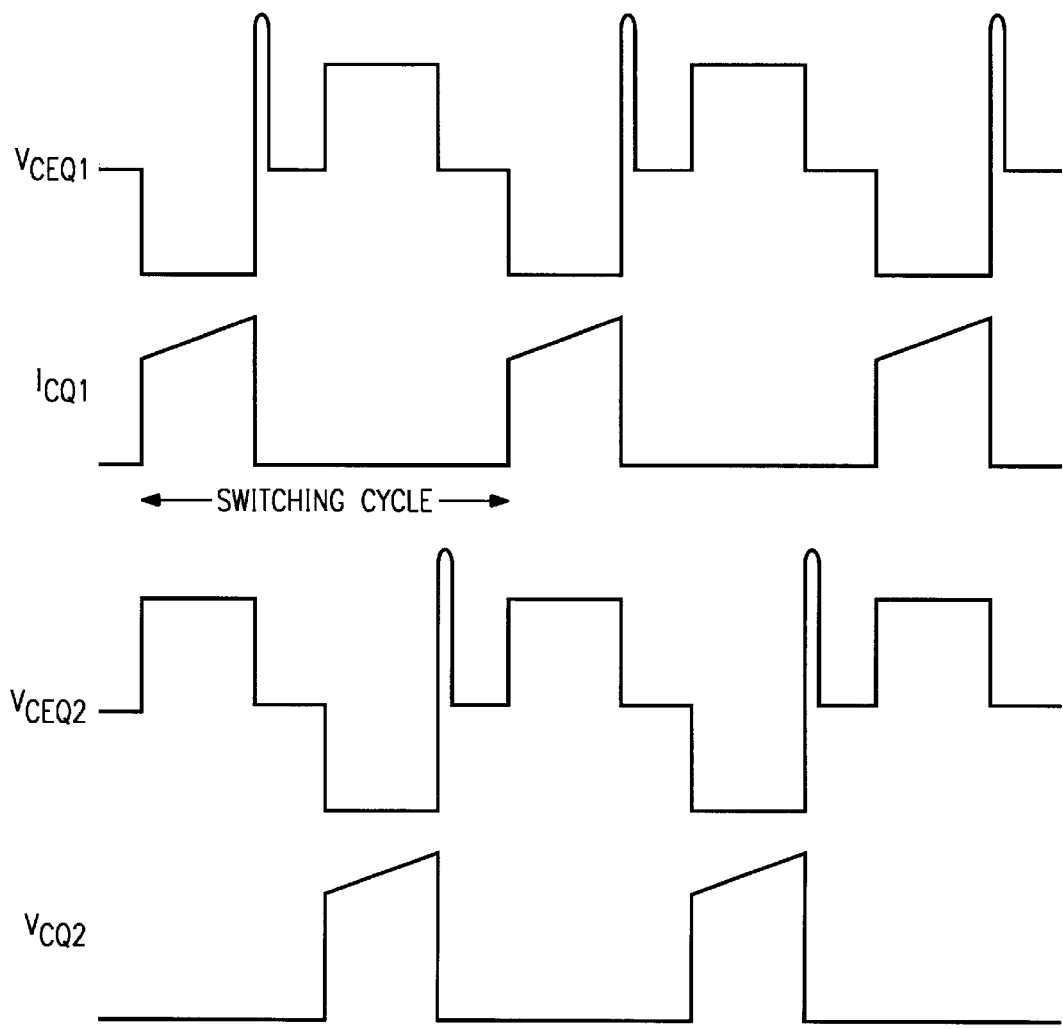
Figure 3:
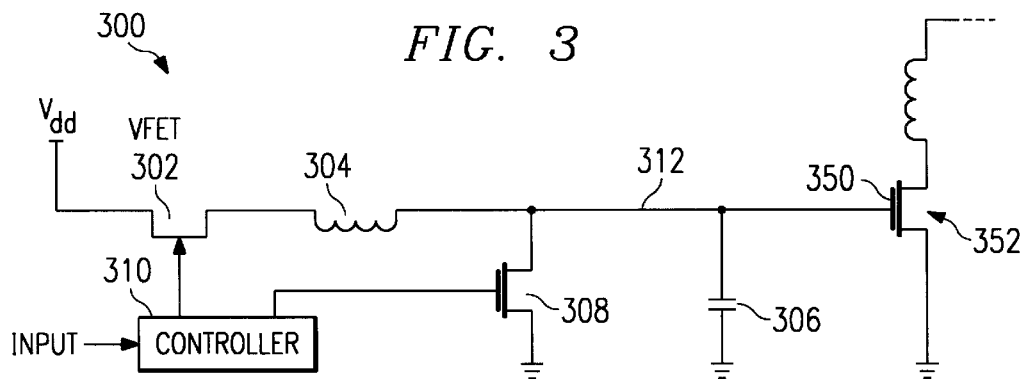
FIG. 3 is a schematic diagram of a first preferred embodiment driver.

FIG. 3 shows in schematic view first preferred embodiment pulse width modulation driver with partial energy recovery, generally denoted by reference numeral 300. Driver 300 controls power MOSFET 352 by charging and discharging gate 350. Two synchronized drivers 300, one for each power MOSFET, Q1 or Q2, could form the pulse width modulation driver of the DC-DC converter of FIG. 1a. That is, the timing of the power MOSFET turning off and on derives from an input signal (the output voltage feedback in FIG. 1a).

Figure 4A:
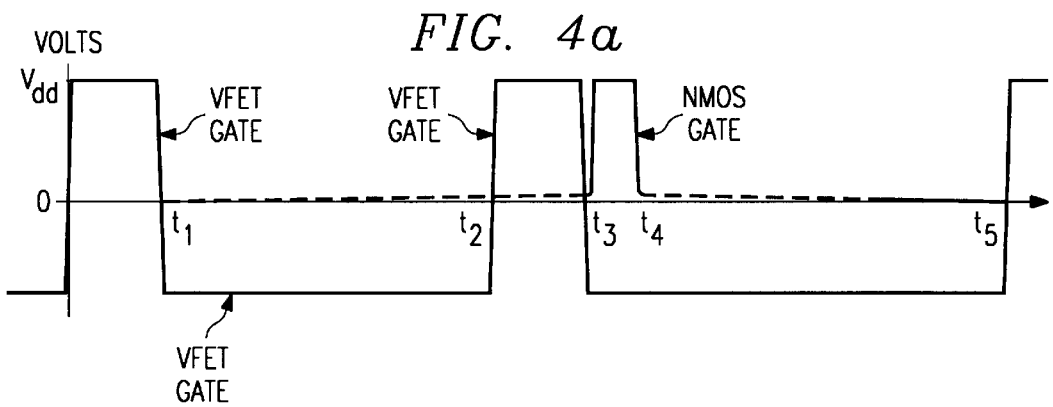
FIGS. 4a–b show the timing for the operation of the first embodiment.

Driver 300 includes vertical field effect transistor (VFET) 302, inductor 304, capacitor 306, NMOS 308, and controller 310 which receives input signals for the timing of the turning off and on of MOSFET 352. VFET 302 acts as a bilateral switch which provides a low resistance (1 ohm) when the gate to source voltage ($V_{GS}$) is zero or positive and provides an open circuit when $V_{GS}$ is less than about −3 volts for a drain-to-source voltage of up to 20 volts; the VFET section below gives more details of VFET 302. Controller 310 provides outputs as illustrated in FIG. 4a with the time interval from time 0 to time $t_2$ being adjustable and determining the duty cycle of power MOSFET 352. The interval from time 0 to time $t_5$ constitutes one complete on-off cycle for MOSFET 352.

Operation

Figure 4B:
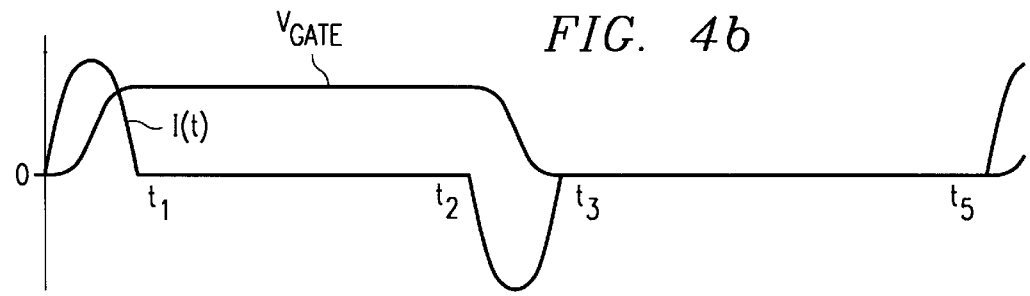

FIG. 4a shows the timing of the signals from controller 310, and FIG. 4b shows the currents and voltages for turning the power MOSFET 352 on and off. In particular, controller 310 turns VFET 302 on at time 0 and turns it off at time $t_1$ by switching the VFET gate voltage from −5 volts to Vdd volt at time 0 and switching it back to −5 volts at time $t_1$. Similarly, controller 310 also turns VFET 302 on at time $t_2$ and turns it off again at time $t_3$. Further, controller 310 turns NMOS 308 on at time $t_3$ by switching its gate from 0 volts to +5 volts and turns it off at time $t_4$ by switching the gate voltage back to 0. This switching of VFET 302 and NMOS 308 has the following results.

First, presume at time 0 that power MOSFET gate 350 is at 0 volts and thus power MOSFET 352 is off. Then VFET 302 turning on at time 0 begins resonantly charging up gate 350 as illustrated in FIG. 4b. This avoids the usual $CV^2/2$ loss incurred with charging up a capacitor by charging through an inductor. In particular, turning on VFET 302 applies the supply voltage Vdd to the series LC circuit made of inductor 304 in series with the capacitance at node 312, which is the parallel combination of capacitor 306 having capacitance $C_{306}$ and the input capacitance $C_{ISS}$ of gate 350. The current I through inductor 304 and charging the capacitors has the form $$I(t)=Vdd\sqrt{(C/L)} \sin [t/\sqrt{(LC)}]$$

where C equals $C_{ISS}+C_{306}$ and L is the inductor 304. Note that this analysis ignores the Miller effect which makes the gate-to-drain capacitance appear multiplied by the amplification factor, so a more accurate approximation would insert a voltage dependent $C_{ISS}$ but the overall analysis would still apply.

Now $t_1$ is chosen equal to $\pi\sqrt{(LC)}$ so that the capacitors charge for just one half cycle; that is, only when I(t) is positive. See the lefthand portion of FIG. 4b for time in the range of 0 to $t_1$.

The voltage on gate 350 ($V_{GATE}$ in FIG. 4b) thus rises as $$V(t)=Vdd\{1-\cos [t/\sqrt{(LC)}]\}$$

and reaches a maximum of 2Vdd at time $t_1$. Because VFET 302 turns off at time $t_1$ when the current I(t) through inductor 304 is zero, no voltage spiking occurs and the voltage on gate 350 holds at 2Vdd until time $t_2$. This means power MOSFET 352 remains turned on for a time interval of length roughly $t_2$.

As an example, presume a switching frequency of 1 MHz. Then the switching cycle is 1000 nanoseconds long, and each power MOSFET may be on for about 300 nanoseconds. Thus for a turn on transition (interval from time 0 to time $t_1$) of 50 nanoseconds with a power MOSFET (such as the Motorola MTM7N45) having a $C_{ISS}$ of 2000 pF, capacitor 306 could be omitted and inductor 304 chosen to have an inductance of 0.1 µH. This is a fairly small inductor for operating voltages of roughly 10 volts as would be the case for Vdd of 5 volts. A charging current on the order of 1 amp would be drawn from the Vdd supply. Power MOSFETs typically require a gate voltage of roughly 5–7 volts for turn on, so a Vdd voltage supply of 5 volts suffices.

Next, at time $t_2$ gate 350 begins discharging to turn off power MOSFET 352 as follows. Initially, gate 350 has a voltage of 2Vdd when VFET 302 turns on and connects gate 350 through inductor 304 to the Vdd power supply. Thus the current I(t) from Vdd through inductor 304 to gate 350 has the form $$I(t)=-Vdd\sqrt{(C/L)} \sin [(t-t_2)/\sqrt{(LC)}]$$

where the minus sign indicates that the current flows from gate 350 to the Vdd power supply. That is, the energy stored in the capacitors during MOSFET 352 turn on returns to the Vdd power supply during the turn off. Again, the time interval $t_3-t_2$ is chosen equal to $\pi\sqrt{(LC)}$ so that the capacitors discharge for just one half cycle; that is, only when I(t) is negative. See the righthand portion of FIG. 4b. Of course, this analysis is approximate, and an optimized selection of the interval $t_3-t_2$ may differ from an optimized selection of the interval $t_1$.

The voltage on gate 350 ($V_{GATE}$ in FIG. 4b) thus falls as $$V(t)=Vdd\{1+\cos [(t-t_2)/\sqrt{(LC)}]\}$$

and reaches 0 at time $t_3$. Because VFET 302 switches to nonconducting at time $t_3$ when the current through inductor 304 is 0 and the voltage on gate 350 is 0, no voltage spiking occurs and gate 350 holds at 0 volts for times greater than $t_3$ during the on/off cycle.

The net effect of the on/off cycle with VFET 302 is recovery of essentially all of the energy used to charge up gate 350 because of the resonant charging and discharging. The only losses result from the resistance of turned-on VFET 302 and the wiring of inductor 304; thus the small inductance required permits small resistive losses.

However, the preceding analysis does not exactly apply and mismatches of parameters cannot be avoided, so controller 310 turns on NMOS 308 from time $t_3$ to time $t_4$, which may be just a few nanoseconds, to insure gate 350 is grounded for MOSFET 352 turnoff. See the righthand portion of FIG. 4a.

The parameters such as the inductance L of inductor 304, the capacitance of capacitor 306, if any, the characteristics of VFET 302, and the voltage of the Vdd power supply will depend upon the circuit requirements such as the input capacitance of the power MOSFET and the frequency of switching so that the turn-on and turn-off transitions will be an adequately small portion of the switching cycle time.

Controller

Figure 1C:
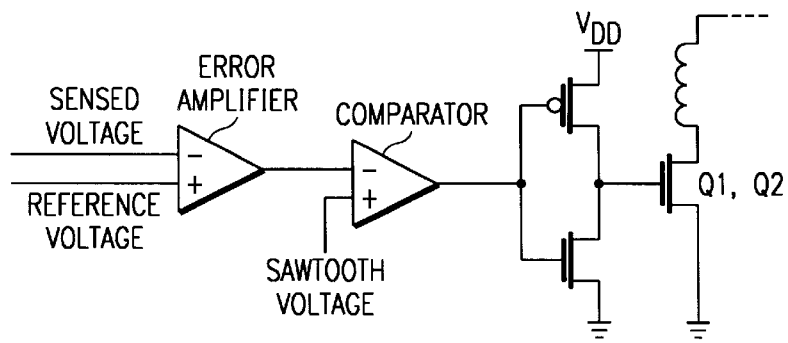
Figure 2A:
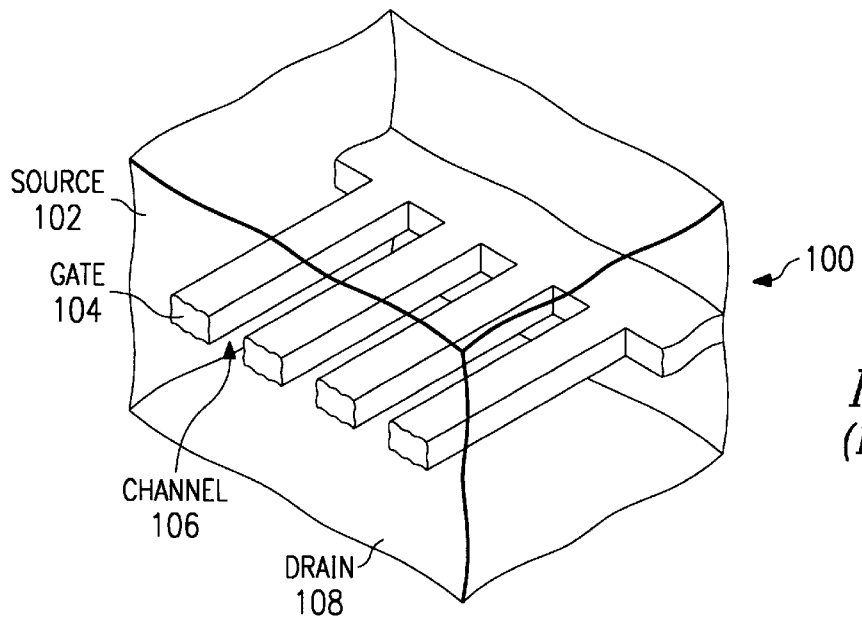
FIGS. 2a–b illustrate a known vertical junction field effect transistor.
Figure 2B:
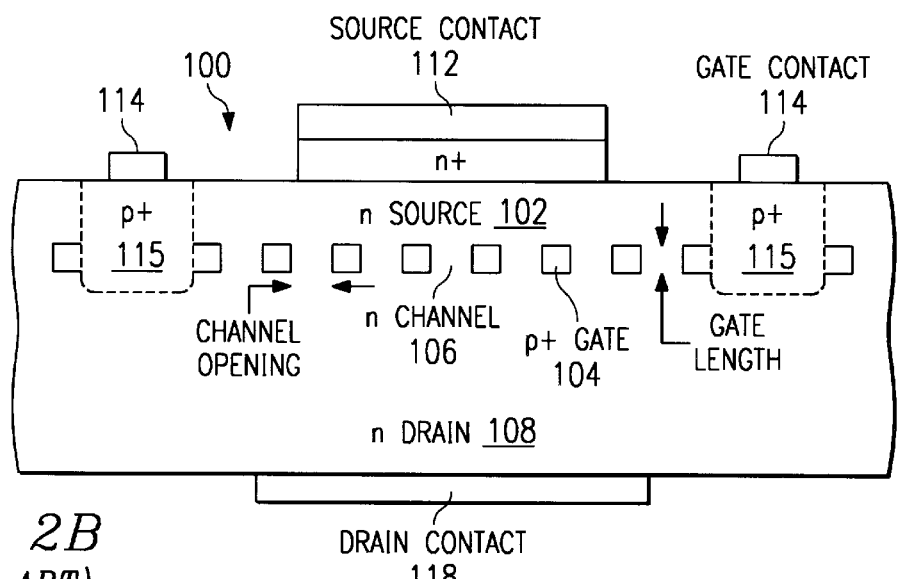
Figure 5:
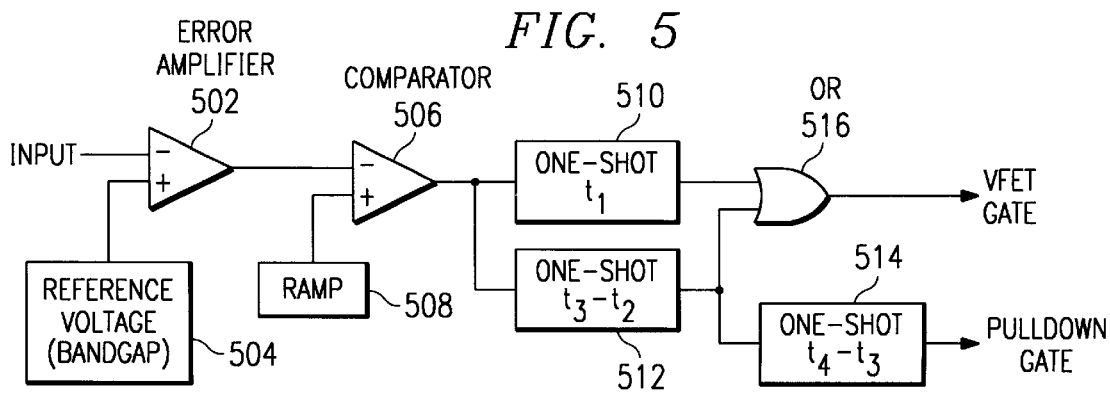
FIG. 5 shows a controller for the first preferred embodiment driver.

FIG. 5 schematically shows a possible controller 310 although other controllers supplying the outputs of FIG. 4a could be used. Controller 310 includes error amplifier 502 with one input (the INPUT for controller 310) a sensed voltage (such as a feedback from the output as in FIG. 1a) and the other input a reference voltage (such as the desired output voltage) derived from bandgap generator 504, comparator 506 with one input the output of error amplifier 502 and the other input a ramp voltage from ramp generator 508 having a frequency set to be the switching frequency for the power MOSFET 352, low-to-high one-shot 510 which provides a high pulse of duration $t_1$ to turn on VFET 302, high-to-low one-shot 512 which provides a high pulse of duration $t_3-t_2$ to turn on VFET 302 and also trigger high-to-low one-shot 514 which provides a high pulse of duration $t_4-t_3$ to turn on NMOS 308. Of course, when the intervals $t_1$ and $t_3-t_2$ are equal, a single one-shot responding to both transitions could be used to drive the gate of VFET 302 and then the one-shot form NMOS 308 would need a divide by 2 latch at its input. OR gate 516 also level shifts to the appropriate VFET gate voltages: Vdd volts for turn on and −3 volts for turn off. As previously described in connection with FIG. 1c, the INPUT voltage level controls the time interval $t_2$ which amounts to the duty cycle of MOSFET 352.

VFET structure

VFET 302 may be made of gallium arsenide (GaAs) and is a multifinger buried gate junction field effect transistor which provides a very low source to drain resistance ($R_{ON}$) when the gate has no bias relative to the source and which provides a very high resistance with a −3 volt bias for drain-to-source voltages of up to 20 volts.

Fabrication

The preferred embodiments may be assembled from discrete components or the components other than the magnetics could be totally or partially fabricated as a silicon integrated circuit or even a GaAs integrated circuit. The negative voltage to turn off a VFET bilateral switch could be supplied by a separate external power supply or by an on-chip charge pump. VFETs made of GaAs or other high mobility semiconductor materials may be discrete or integrated with diodes and small inductors; or integrated with silicon components via heteroepitaxy.

Modifications

The preferred embodiments may be varied in many ways while retaining one or more of the features of a bilateral switch with series inductance for resonant charging and discharging for capacitive loads.

For example, the resonant charging may not be for exactly $\pi\sqrt{(LC)}$ and thus the final voltage on the capacitive load may be smaller, such as 1.5 Vdd. Further, pulldown switch turnon could slightly overlap or be separated from the turnoff of the bilateral switch, the inductance would limit any shoot-through current. The inductance for the resonant charging and discharging could be a discrete inductor or an inductance integrated with a circuit including some or all of the other components of the system such as the controller or VFET. Other bilateral switches and controllers and pulldown switches could be used. Ground could be replaced by some other reference voltage.

What is claimed is:

1. A charging and discharging circuit for a capacitive load, comprising:
   (a) an inductance coupled to an output node;
   (b) a bilateral switch coupling said inductance to a supply voltage; and
   (c) a controller switching said bilateral switch, wherein said controller provides turn on and turn off pulses for said bilateral switch with pulse duration for both turn on and turn off pulses equal to about $\pi\sqrt{(LC)}$ with L said inductance and C the capacitance at said output node.

2. The circuit of claim 1, further comprising:
   (a) a pulldown switch coupling said output node to a reference voltage; and
   (b) said controller switching said pulldown switch;
   (c) whereby said controller provides turn on pulses for said pulldown switch after ones of said turn off pulses.

3. The circuit of claim 1, wherein:
   (a) said capacitive load charges to at least 1.5 times said supply voltage.

4. The circuit of claim 1, further comprising:
   (a) a capacitor in parallel with said pulldown switch.

5. The circuit of claim 4, wherein:
   (a) said bilateral switch is a vertical field effect transistor;
   (b) said pulldown switch is a field effect transistor; and
   (c) said reference potential is ground.

6. The circuit of claim 5, wherein:
   (a) said vertical field effect transistor is made of GaAs.

7. A method of charging and discharging a capacitive load, comprising the steps of:
   (a) connecting a discharged capacitive load to a voltage supply through an inductance to charge said capacitive load;
   (b) disconnecting said capacitive load from said voltage supply after a time interval of about $\pi\sqrt{(LC)}$ with L said inductance and C the capacitance at said load;
   (c) connecting said charged capacitive load to a voltage supply through said inductance; and
   (d) disconnecting said capacitive load from said voltage supply after a time interval of about $\pi\sqrt{(LC)}$.

8. The method of claim 7, wherein:
   (a) said connecting and disconnecting is by a vertical field effect transistor turning on and off.

9. The method of claim 8, further comprising the steps of:
   (a) after a second time interval, again connecting said capacitive load to said voltage supply through said inductance; and
   (b) again disconnecting said capacitive load from said voltage supply after a time interval of about $\pi\sqrt{(LC)}$.

10. The method of claim 9, wherein:
    (a) said capacitive load charges to at least 1.5 times said voltage supply.

* * * * *